United States Patent
Hayashi

(10) Patent No.: US 8,748,276 B2
(45) Date of Patent: Jun. 10, 2014

(54) METHOD FOR MANUFACTURING SEMICONDUCTOR DEVICE

(75) Inventor: Hideki Hayashi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/539,925

(22) Filed: Jul. 2, 2012

(65) Prior Publication Data

US 2013/0017675 A1    Jan. 17, 2013

Related U.S. Application Data

(60) Provisional application No. 61/507,847, filed on Jul. 14, 2011.

(30) Foreign Application Priority Data

Jul. 14, 2011    (JP) .................................. 2011-155287

(51) Int. Cl.
*H01L 21/336* (2006.01)
*H01L 21/266* (2006.01)

(52) U.S. Cl.
USPC ........... 438/285; 438/518; 438/931; 438/945; 257/E21.058; 257/E21.346

(58) Field of Classification Search
USPC .......... 438/518, 931, 945, 285; 257/E21.058, 257/E21.346
See application file for complete search history.

(56) References Cited

U.S. PATENT DOCUMENTS

| 2007/0158683 | A1 | 7/2007 | Sheppard et al. |
| 2009/0032848 | A1* | 2/2009 | Treu et al. ..................... 257/256 |
| 2010/0032685 | A1 | 2/2010 | Zhang et al. |
| 2010/0035420 | A1* | 2/2010 | Tamaso et al. ................ 438/514 |

FOREIGN PATENT DOCUMENTS

| JP | 2001-185724 A | * | 7/2001 |
| JP | 2007-189213 | | 7/2007 |
| JP | 2010-045363 | | 2/2010 |

* cited by examiner

*Primary Examiner* — Zandra Smith
*Assistant Examiner* — Toniae Thomas
(74) *Attorney, Agent, or Firm* — Venable LLP; Michael A. Sartori; Steven J. Schwarz

(57) ABSTRACT

A through portion is formed on a semiconductor substrate. Into the semiconductor substrate, a first ion implantation is performed via the through portion. The through portion is at least partially removed in the thickness direction from a region of at least a portion of the through portion when viewed in a plan view. A second ion implantation is performed into the semiconductor substrate at the region of at least the portion thereof. An implantation energy for the first ion implantation is equal to an implantation energy for the second ion implantation.

5 Claims, 9 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, in particular, a method for manufacturing a semiconductor device including a step of performing ion implantation.

2. Description of the Background Art

A step of performing ion implantation to form an impurity region is one of basic steps in a method for manufacturing a semiconductor device. The ion implantation may be performed for a plurality of times with different implantation energies in order to obtain a desired impurity concentration distribution in the impurity region in a depth direction. For example, Japanese Patent Laying-Open No. 2010-45363 discloses an example in which ion implantation is performed for five times in total in order to form, in silicon carbide, a doping distribution with a concentration of approximately $1 \times 10^{17}$ $cm^{-3}$ and a depth of approximately 0.6 μm. The implantation energies differ from one another among these five ion implantations. Specifically, the implantation energies are 40 keV, 100 keV, 200 keV, 280 keV, and 360 keV.

In the technique of the above-described publication, the plurality of ion implantation steps are performed with the different implantation energies. In consideration of facility cost, it is difficult to prepare one ion implanting device for each implantation energy. Hence, in the technique of the above-described publication, it is necessary to adjust a setting value for the implantation energy. However, when the implantation energy is changed, it takes a long time to stabilize the device. This leads to low efficiency in manufacturing semiconductor devices.

SUMMARY OF THE INVENTION

The present invention has been made to solve such a problem, and has its object to provide a method for manufacturing a semiconductor device so as to achieve increased manufacturing efficiency by increasing utilization efficiency of an ion implanting device.

A method for manufacturing a semiconductor device in the present invention includes the following steps. A through portion is formed on a semiconductor substrate. A first ion implantation is performed into the semiconductor substrate via the through portion. The through portion is at least partially removed in a thickness direction from a region of at least a portion of the through portion when viewed in a plan view. A second ion implantation is performed into the semiconductor substrate at the region of at least the portion thereof. An implantation energy for the first ion implantation is equal to an implantation energy for the second ion implantation.

According to the method for manufacturing the semiconductor device in the present invention, by at least partially removing the through portion, the stopping power of the through portion for ions is adjusted. By such adjustment of the stopping power, the location to have ions implanted therein can be adjusted. Thus, the implantation energy does not need to be changed, thereby achieving increased utilization efficiency for the ion implanting device. Accordingly, efficiency in manufacturing semiconductor devices can be increased.

Preferably, the step of at least partially removing the through portion is the step of partially removing the through portion in the thickness direction. Thus, not only the first ion implantation but also the second ion implantation can be performed via the through portion.

Preferably, in the step of forming the through portion, a stack is formed which has a first film and a second film provided on the first film and made of a material different from that of the first film. In the step of at least partially removing the through portion, the second film is removed while the first film remains. Thus, when partially removing the through portion, an etching selectivity between the material of the first film and the material of the second film can be utilized.

Preferably, the semiconductor substrate is a silicon carbide substrate. Thus, although silicon carbide thus used is a material in which an impurity is less likely to be diffused to result in a difficulty in forming a desired distribution of the impurity, efficiency in manufacturing semiconductor devices can be increased.

Preferably, an ion implantation mask is formed on the through portion. Thus, ion implantation can be selectively performed to a specific location when viewed in a plan view.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
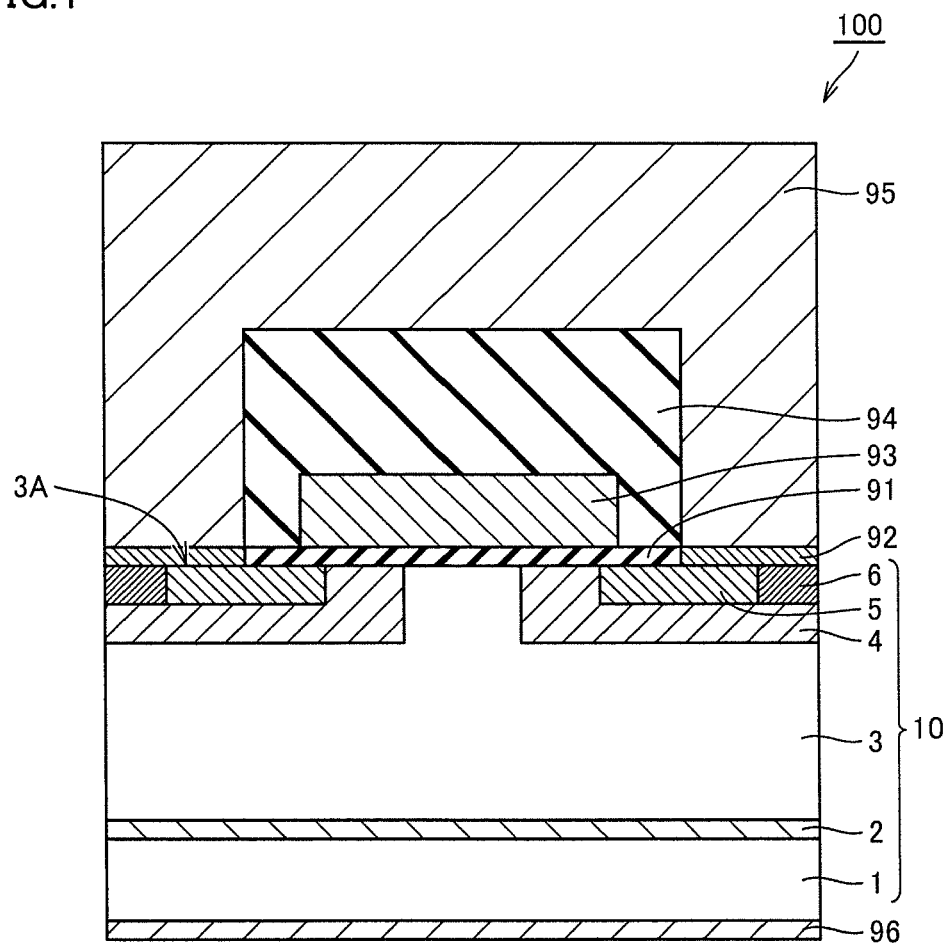
FIG. 1 is a cross sectional view schematically showing a configuration of a semiconductor device in one embodiment of the invention of the present application.

The following describes an embodiment of the present invention with reference to figures. It should be noted that in the below-mentioned figures, the same or corresponding portions are given the same reference characters and are not described repeatedly. Further, regarding crystallographical indications in the present specification, an individual plane is represented by ( ) and a group plane is represented by { }. In addition, a negative index is supposed to be crystallographically indicated by putting "–" (bar) above a numeral, but is indicated by putting the negative sign before the numeral in the present specification.

As shown in FIG. 1, a semiconductor device of the present embodiment is a MOSFET 100 (Metal Oxide Semiconductor Field Effect Transistor) particularly suitable for a power semiconductor device. More specifically, MOSFET 100 is a vertical type DiMOSFET (Double-Implanted MOSFET). MOSFET 100 includes: an epitaxial substrate 10 (semiconductor substrate) serving as a silicon carbide substrate; a gate oxide film 91 (gate insulating film); source contact electrodes 92; a gate electrode 93; an interlayer insulating film 94; a source wire 95; and a drain electrode 96. In the present embodiment, epitaxial substrate 10 is a silicon carbide substrate, and includes a single-crystal substrate 1, a buffer layer 2, a drift layer 3, a pair of body regions 4, n$^+$ regions 5, and p$^+$ regions 6.

Single-crystal substrate 1 is made of silicon carbide single-crystal. Preferably, the silicon carbide single-crystal has a hexagonal crystal structure. More preferably, single-crystal substrate 1 has a plane orientation of {03-38}. Further preferably, single-crystal substrate 1 has a surface (also referred to as "upper surface") that faces drift layer 3 and that corresponds to the (0-33-8) plane.

Drift layer 3 is provided over the upper surface of single-crystal substrate 1 with buffer layer 2 interposed therebetween, and has a thickness direction (vertical direction in FIG. 1) throughout which a current flows. Further, drift layer 3 is of n type (first conductivity type), and has an impurity concentration of, for example, not less than $1 \times 10^{14}$ cm$^{-3}$ and not more than $1 \times 10^{17}$ cm$^{-3}$.

Buffer layer 2 has the same conductivity type as that of drift layer 3, i.e., has n type conductivity. Single-crystal substrate 1 has the same conductivity type as that of drift layer 3, i.e., has n type conductivity. An exemplary, usable impurity in buffer layer 2 is N (nitrogen). Drift layer 3 has an n type impurity concentration smaller than that of buffer layer 2.

The pair of body regions 4 are provided in portions of drift layer 3 and are separated from each other. Each of body regions 4 has a channel to be switched by gate electrode 93. The length of the channel, i.e., channel length, is not less than 0.1 μm and not more than 1 μm, for example.

Each of body regions 4 has p type conductivity (second conductivity type) different from that of the drift layer, and has an impurity concentration of, for example, not less than $5 \times 10^{16}$ cm$^{-3}$ and not more than $2 \times 10^{18}$ cm$^3$. An exemplary, usable impurity is aluminum (Al) or boron (B). Body region 4 has a thickness of, for example, not less than 0.5 μm and not more than 1 μm.

Each of n$^+$ regions 5 has the same conductivity type (first conductivity type) as that of drift layer 3, i.e., has n type conductivity. Further, n$^+$ region 5 is disposed in and surrounded by body region 4. N$^+$ region 5 can contain, for example, phosphorus (P) as an impurity.

Each of p$^+$ regions 6 has the same conductivity type (second conductivity type) as that of body region 4, i.e., has p type conductivity. P$^+$ region 6 is disposed in and surrounded by body region 4 and is adjacent to n$^+$ region 5. P$^+$ region 6 has a p type impurity concentration greater than that of body region 4.

Gate oxide film 91 is formed to extend from a portion above the upper surface of one n$^+$ region 5 to a portion above the upper surface of the other n$^+$ region 5. The gate oxide film is formed of, for example, silicon dioxide (SiO$_2$).

Gate electrode 93 is configured to switch a current, and is disposed on gate oxide film 91. Gate electrode 93 is made of a conductor. For example, gate electrode 93 is made of polysilicon having an impurity added thereto, a metal such as Al, or an alloy.

Each of source contact electrodes 92 extends from a portion above each of the pair of n$^+$ regions 5 in a direction away from gate oxide film 91 to reach a portion above p$^+$ region 6. Source contact electrode 92 is made of a material capable of ohmic contact with n$^+$ region 5. Source contact electrode 92 is preferably made of a silicide such as nickel silicide (Ni$_x$Si$_y$).

Interlayer insulating film 94 covers gate electrode 93. Interlayer insulating film 94 is made of, for example, silicon dioxide (SiO$_2$).

Source wire 95 has a portion disposed on interlayer insulating film 94 and a portion disposed on source contact electrode 92. Source wire 95 is preferably made of a metal or an alloy.

Drain electrode 96 is disposed on the backside surface of single-crystal substrate 1. Drain electrode 96 is made of a material capable of ohmic contact with single-crystal substrate 1. Preferably, drain electrode 96 is made of a silicide such as nickel silicide (Ni$_x$Si$_y$).

The following describes a method for manufacturing MOSFET 100.

Figure 2:
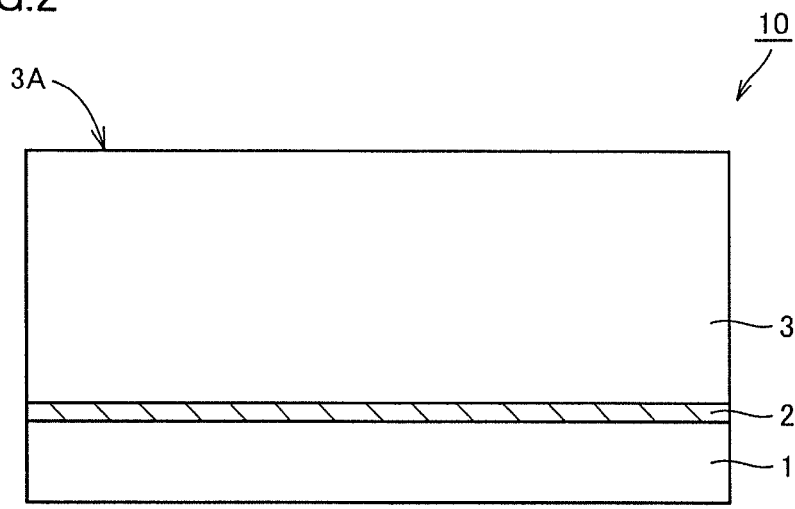
FIG. 2 to FIG. 15 are cross sectional views respectively schematically showing first to fourteenth steps of a method for manufacturing the semiconductor device in the embodiment of the invention of the present application.

As shown in FIG. 2, buffer layer 2 and drift layer 3 are epitaxially grown in this order on single-crystal substrate 1. In this way, epitaxial substrate 10 having a surface 3A composed of drift layer 3 is formed.

Next, body regions 4 (FIG. 1) are formed in drift layer 3. Specifically, the following steps (FIG. 3 to FIG. 13) are performed.

Figure 3:
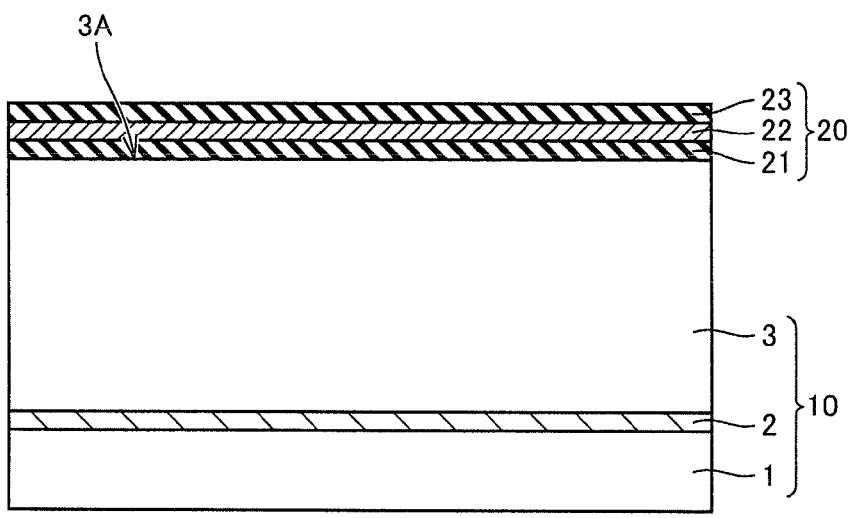

As shown in FIG. 3, a through portion 20 is formed on surface 3A of epitaxial substrate 10. Specifically, a stack having films 21-23 is formed on surface 3A. Films 21-23 are provided in this order on surface 3A. Film 23 is made of a first material, and film 22 is made of a second material different from the first material. Film 21 may be made of the first material, as with film 23. One of the first and second materials is a metal or polysilicon, and the other is a dielectric, for example.

Figure 4:
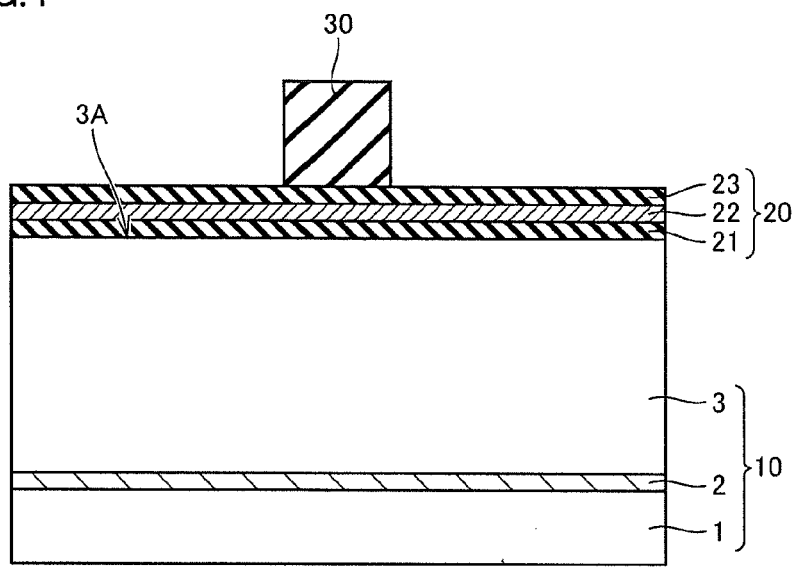

As shown in FIG. 4, an ion implantation mask 30 is formed on through portion 20. Ion implantation mask 30 is patterned so as to cover a region not to be subjected to ion implantation. Ion implantation mask 30 has a thickness sufficient to shield from an ion beam in the below-described ion implantation. Ion implantation mask 30 is made of, for example, silicon oxide.

Figure 5:
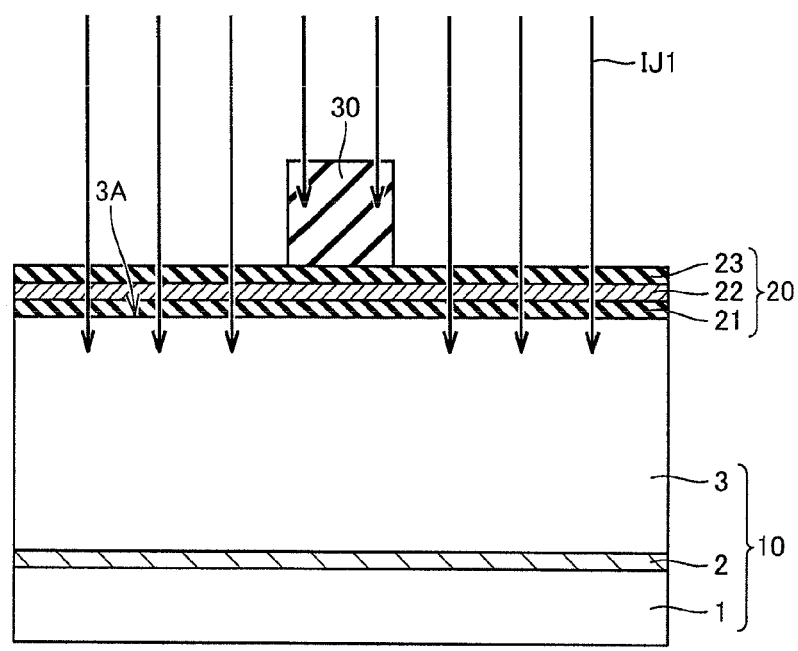

As shown in FIG. 5, ion implantation IJ1 (first ion implantation) is performed. An ionic species to be implanted corresponds to an impurity for providing drift layer 3 with p type conductivity (second conductivity type). Using ion implantation mask 30, ion implantation IJ1 is performed into epitaxial substrate 10 via through portion 20. The ion beam passes through films 23, 22, and 21 in this order to come into epitaxial substrate 10. Accordingly, the ion beam loses energy corresponding to a total of respective stopping powers of films 21-23, before reaching epitaxial substrate 10. Hence, the impurity is implanted at shallower locations as compared with a case where films 21-23 are not provided.

Figure 6:
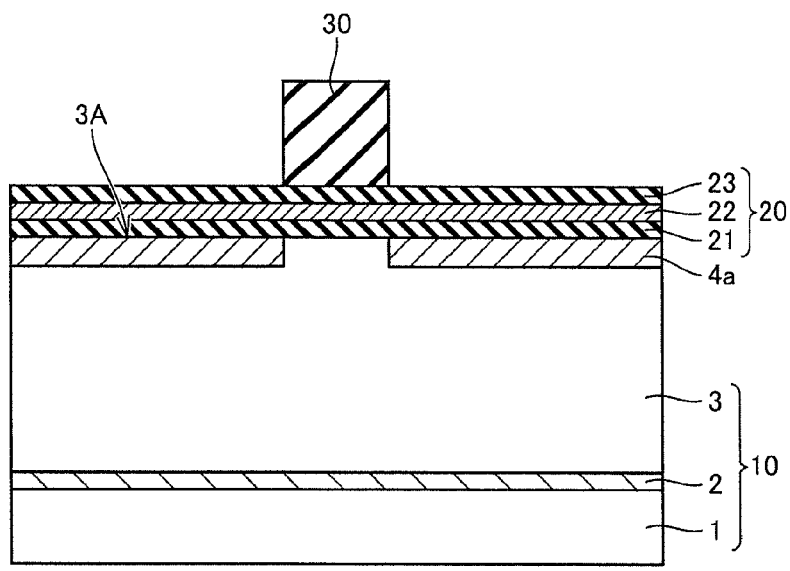

As shown in FIG. 6, as a result of ion implantation IJ1 described above, impurity regions 4a are formed in drift layer 3.

Figure 7:
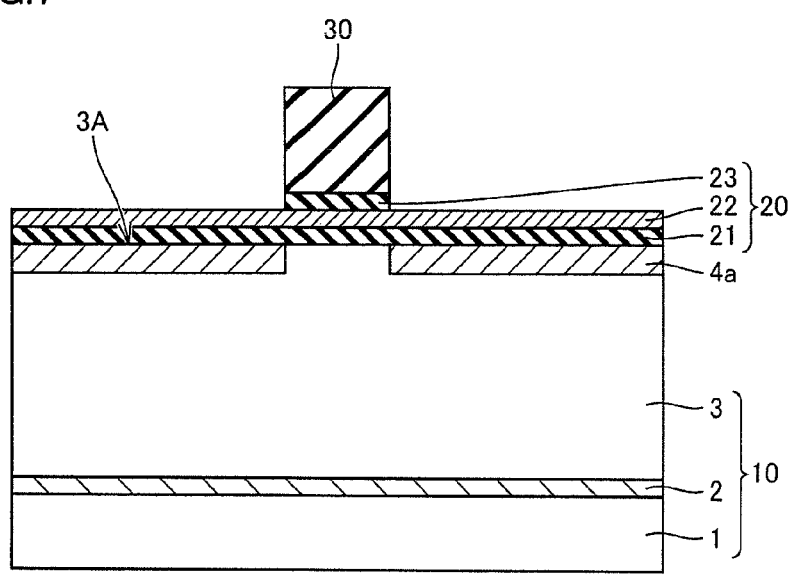

As shown in FIG. 7, portions of through portion 20 are removed in the thickness direction (longitudinal direction in the figure) from the regions not covered with ion implantation mask 30 when viewed in a plan view (field of vision from above in FIG. 7). More specifically, film 23 in the regions not covered with ion implantation mask 30 when viewed in a plan view are removed by means of etching, while films 21 and 22 remain. This step can be performed with good precision by using an etching selectivity between the material of film 23 and the material of film 22.

Figure 8:
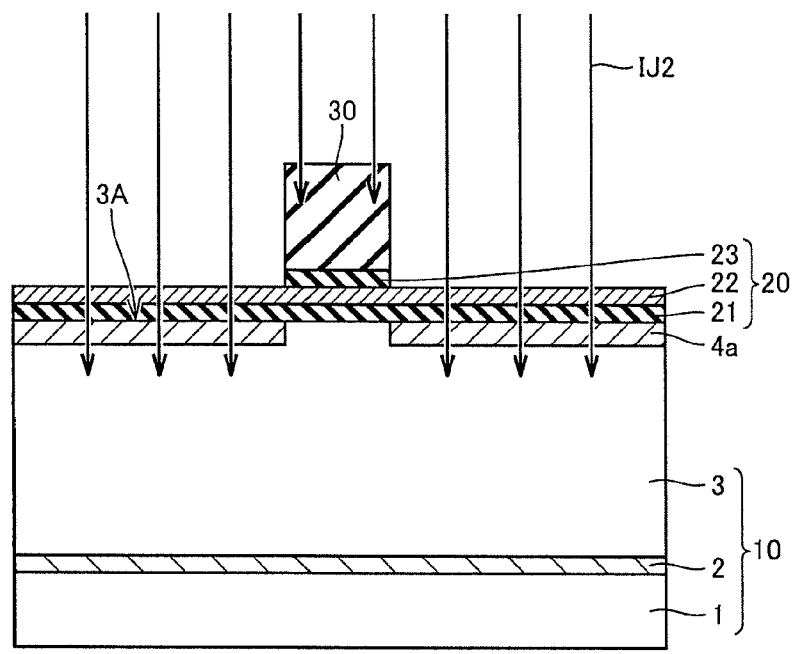

As shown in FIG. 8, ion implantation IJ2 is performed into epitaxial substrate 10 at the regions not covered with ion implantation mask 30, i.e., the regions from which the portions of through portion 20 have been removed in the step of FIG. 7 when viewed in a plan view. The implantation energy for ion implantation IJ2 is equal to that for ion implantation IJ1 (FIG. 5). Further, an ionic species to be implanted is the same as that in ion implantation IJ1.

Figure 9:
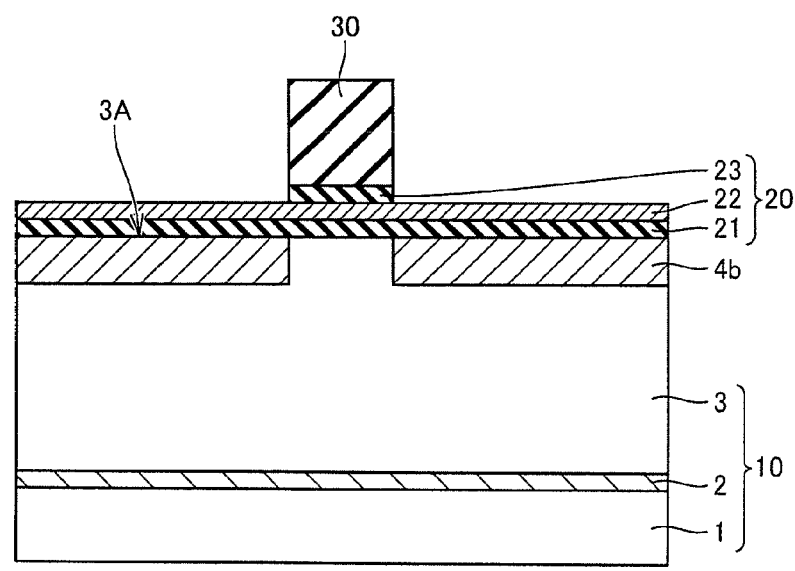

As shown in FIG. 9, as a result of ion implantation IJ2 described above, impurity regions 4a (FIG. 6) are expanded in the depth direction of drift layer 3, thereby forming impurity regions 4b.

Figure 10:
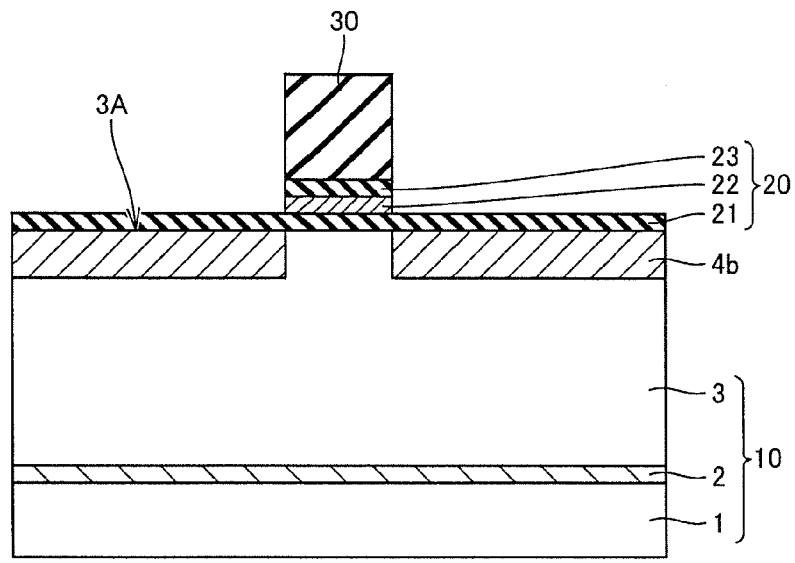

As shown in FIG. 10, portions of through portion 20 are removed in the thickness direction (longitudinal direction in the figure) from the regions not covered with ion implantation mask 30 when viewed in a plan view (field of vision from above in FIG. 10). More specifically, film 22 in the regions not covered with ion implantation mask 30 when viewed in a plan view are removed by means of etching, while film 21 remains. This step can be performed with good precision by using an etching selectivity between the material of film 22 and the material of film 21.

Figure 11:
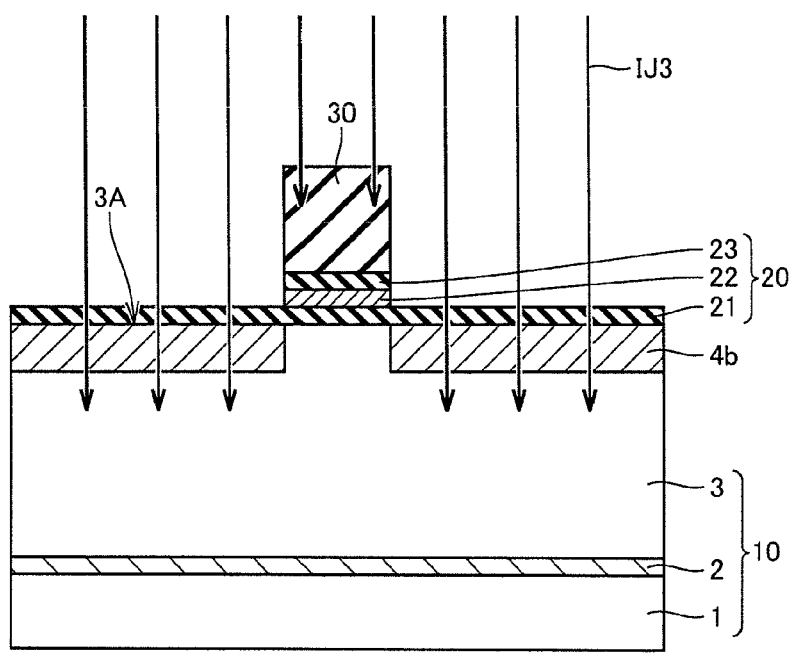

As shown in FIG. 11, ion implantation IJ3 is performed into epitaxial substrate 10 at the regions not covered with ion implantation mask 30, i.e., the regions from which the portions of through portion 20 have been removed in the step of FIG. 10 when viewed in a plan view. The implantation energy for ion implantation IJ3 is equal to that for ion implantation IJ2 (FIG. 8). Further, an ionic species to be implanted is the same as that in ion implantation IJ2.

Figure 12:
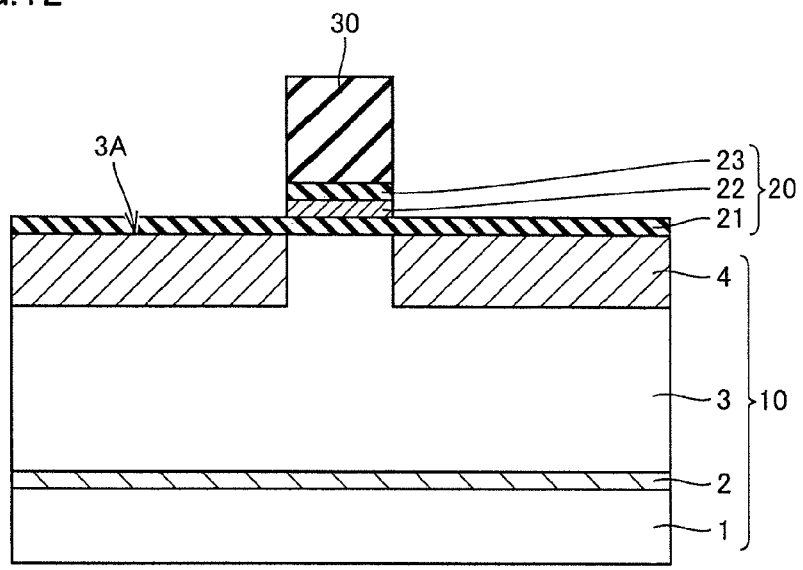

As shown in FIG. 12, as a result of ion implantation IJ3 described above, impurity regions 4b (FIG. 9) are expanded in the depth direction of drift layer 3, thereby forming body regions 4. Next, ion implantation mask 30 and through portion 20 are removed.

Figure 13:
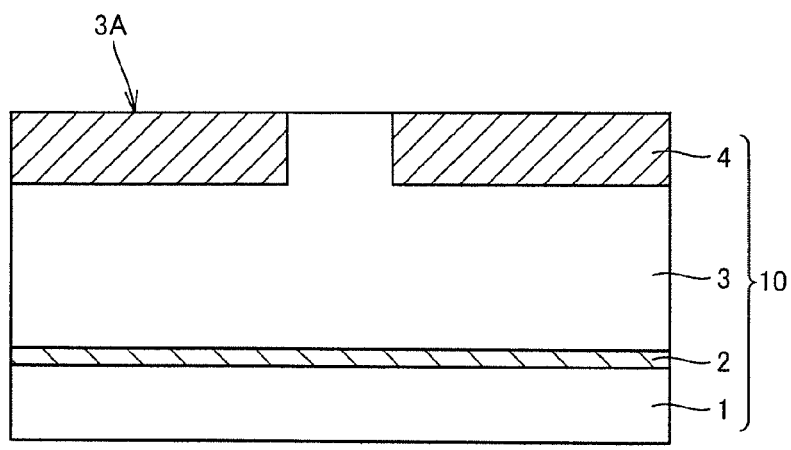

As shown in FIG. 13, body regions 4 are formed in drift layer 3 through the above-described steps (FIG. 3 to FIG. 12).

Figure 14:
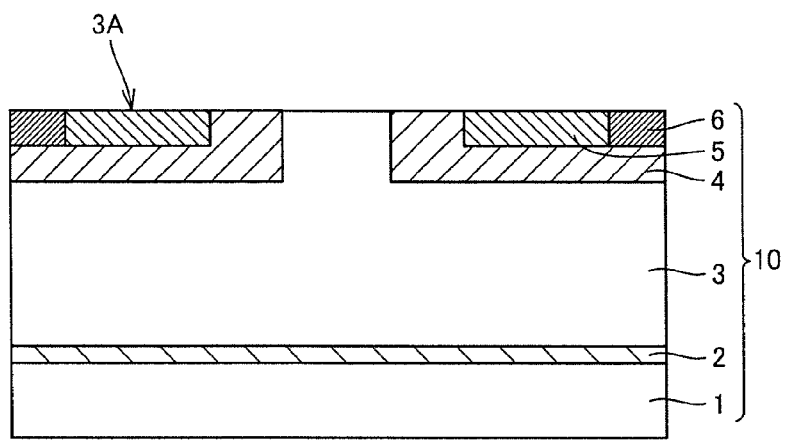

As shown in FIG. 14, $n^+$ regions 5 and $p^+$ regions 6, i.e., contact regions are formed.

Next, activation annealing is performed to activate the implanted impurities. For example, the activation annealing is performed under an argon (Ar) atmosphere at an annealing temperature of 1700° C. for an annealing time of 30 minutes.

Figure 15:
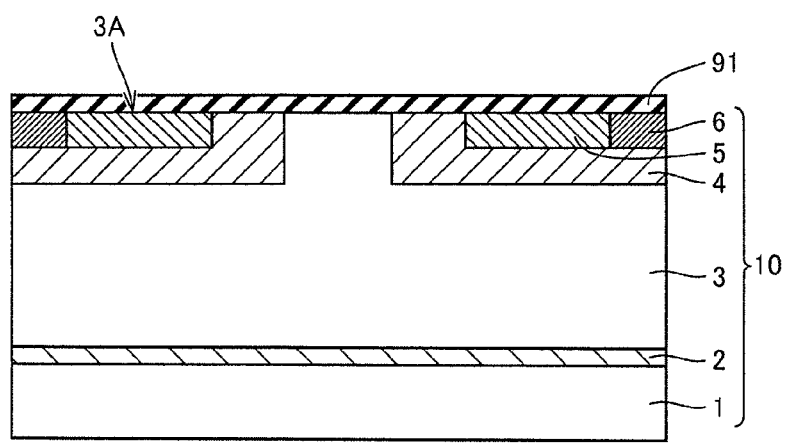

Next, as shown in FIG. 15, gate oxide film 91 is formed. Gate oxide film 91 can be formed through, for example, thermal oxidation of silicon carbide in an oxygen atmosphere. For example, it is performed at an annealing temperature of 1300° C. for an annealing time of 60 minutes.

Next, as shown in FIG. 1, gate electrode 93, source contact electrodes 92, and drain electrode 96 are formed. Specifically, the following steps are performed.

First, gate electrode 93 is formed by means of film formation and patterning. An exemplary, usable method for the film formation is a CVD (Chemical Vapor Deposition) method. Next, for example, using the CVD method, interlayer insulating film 94 is deposited to cover gate electrode 93. Next, in order to secure regions in which source contact electrodes 92 are to be formed, portions of interlayer insulating film 94 and gate oxide film 91 are removed. Next, source contact electrodes 92 and drain electrode 96 are formed. For the formation thereof, for example, nickel (Ni) films are formed using a deposition method and are then silicided. Next, source wire 95 is formed using, for example, the deposition method.

With the above procedure, MOSFET 100 is completed.

The following describes an impurity concentration profile in each of body regions 4 formed in the present embodiment, i.e., describes a relation between a depth DP from surface 3A (FIG. 1) and an impurity concentration ID per volume in body region 4.

Figure 16:
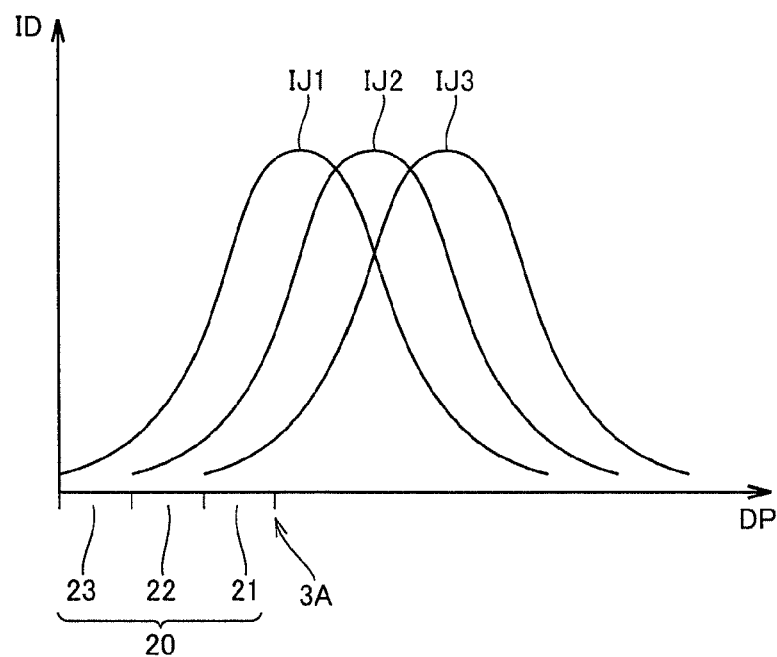
FIG. 16 is a graphical representation showing exemplary impurity concentration profiles respectively corresponding to a plurality of ion implantation steps performed in the method for manufacturing the semiconductor device in the embodiment of the invention of the present application.
Figure 17:
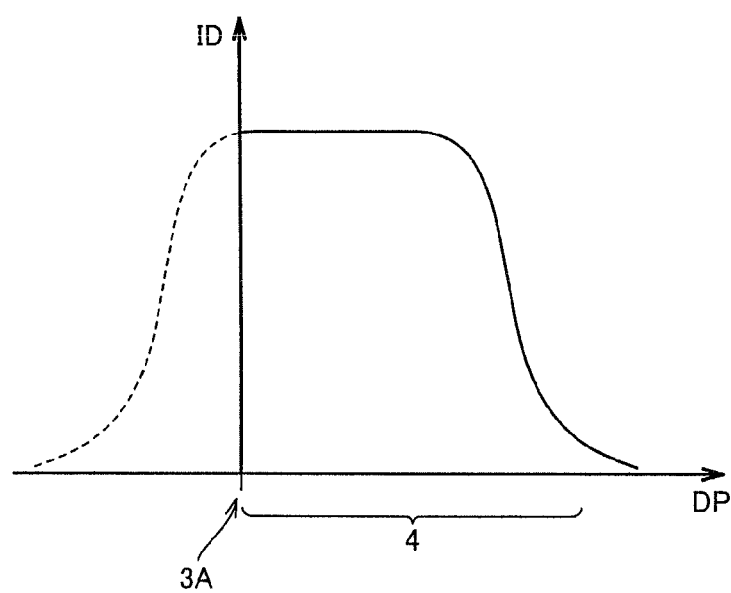
FIG. 17 is a graphical representation showing an exemplary impurity concentration profile formed in the method for manufacturing the semiconductor device in the embodiment of the invention of the present application.

According to the present embodiment, body region 4 is formed by means of ion implantations IJ1-IJ3 (FIG. 16) that utilize the same implantation energy. Ion implantation IJ1 loses energy corresponding to the total of the respective stopping powers of films 21-23, before reaching surface 3A of epitaxial substrate 10. Ion implantation IJ2 loses energy corresponding to the total of the respective stopping powers of films 21 and 22, before reaching surface 3A of epitaxial substrate 10. Ion implantation IJ3 loses energy corresponding to the stopping power of film 21, before reaching surface 3A of epitaxial substrate 10. Among ion implantations IJ1-IJ3, there occurs a difference in ion kinetic energy when reaching surface 3A. This results in a difference in peak location among impurity concentration profiles formed by the ion implantations. With the difference in peak location among the impurity concentration profiles formed by ion implantations U1-U3, the impurity concentration profile (FIG. 17) of body region 4, which is finally formed by ion implantations U1-U3, has a flatter peak than those of the impurity concentration profiles respectively formed by ion implantations IJ1-IJ3.

The function and effect will be discussed in a more general manner as follows. That is, as a result of the partial removal of through portion 20, the stopping power of through portion 20 for ions is adjusted. Through such adjustment of the stopping power, the location to have ions implanted therein can be adjusted. Accordingly, the implantation energy does not need to be changed, thereby achieving increased utilization efficiency of the ion implanting device. This leads to increased manufacturing efficiency for MOSFET 100.

In the description concerned with the above-described embodiment, body region 4 is formed by means of three ion implantations IJ1-IJ3, but the number of ion implantations is not limited to three in forming one impurity region, as long as a plurality of ion implantations are performed. The number of stacked layers in the stack of through portion 20 can be determined depending on the number of ion implantations.

Further, in the description concerned with the above-described embodiment, final ion implantation IJ3 (FIG. 11) for forming body region 4 is performed using film 21 of through portion 20, but the final ion implantation among a plurality of ion implantations for forming one region may be performed without using through portion 20.

It has been illustrated above that the impurity concentration profile of body region 4, which is finally formed by the combination of the plurality of ion implantations IJ1-IJ3, has a flatter peak, but the impurity concentration profile thereof is not limited to this and can be determined depending on a purpose of an impurity region to be formed.

Further, in the case where the etching selectivity does not need to be employed in the partial removal of through portion 20 in the thickness direction thereof, through portion 20 may be constituted of one material.

Further, in the case where the removal of through portion 20 in the thickness direction is performed for a plurality of times, regions to be removed in the removals may be different from each other when viewed in a plan view. In this way, the impurity concentration profile can be controlled not only in the depth direction but also in the in-plane direction.

Further, the silicon carbide substrate serving as a semiconductor substrate is not limited to the epitaxial substrate, and may be, for example, a single-crystal substrate having no epitaxial layer. Further, the semiconductor substrate is not limited to the silicon carbide substrate, and may be, for example, a silicon substrate or a gallium nitride substrate.

Further, the first conductivity type corresponds to n type and the second conductivity type corresponds to p type. However, because the first and second conductivity types may be different from each other, the first conductivity type may correspond to p type and the second conductivity type may correspond to n type. However, in the case where the first conductivity type corresponds to n type and the second conductivity type corresponds to p type, channel resistance can be smaller than that in the case where the first conductivity type corresponds to p type and the second conductivity type corresponds to n type.

Further, the gate insulating film is not limited to the oxide film. Hence, the semiconductor device may be a MISFET (Metal Insulator Semiconductor Field Effect Transistor) other than the MOSFET. Further, the semiconductor device is not limited to the MISFET, and may be, for example, an IGBT (Insulated Gate Bipolar Transistor).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a semiconductor device, comprising the steps of:
    forming a film on a semiconductor substrate;
    performing a first ion implantation into said semiconductor substrate through said film;
    at least partially removing said film; and
    performing a second ion implantation into said semiconductor substrate through said film after at least partially removing said film, an implantation energy for said first ion implantation being equal to an implantation energy for said second ion implantation.

2. The method for manufacturing the semiconductor device according to claim 1, wherein the step of at least partially removing said film includes the step of partially removing said film in a thickness direction.

3. The method for manufacturing the semiconductor device according to claim 1, wherein:
    the step of forming said film includes the step of forming a stacked film having a first film and a second film provided on said first film and made of a material different from that of said first film, and
    the step of at least partially removing said film includes the step of removing said second film while said first film remains.

4. The method for manufacturing the semiconductor device according to claim 1, wherein said semiconductor substrate is a silicon carbide substrate.

5. The method for manufacturing the semiconductor device according to claim 1, further comprising the step of forming an ion implantation mask on said film.

* * * * *